United States Patent [19]
Glovatsky et al.

[11] Patent Number: 5,994,648
[45] Date of Patent: Nov. 30, 1999

[54] THREE-DIMENSIONAL MOLDED SOCKETS FOR MECHANICAL AND ELECTRICAL COMPONENT ATTACHMENT

[75] Inventors: Andrew Z. Glovatsky, Ypsilanti; Michael G. Todd, South Lyon; Cuong Van Pham, Northville, all of Mich.

[73] Assignee: Ford Motor Company, Dearborn, Mich.

[21] Appl. No.: 08/826,461

[22] Filed: Mar. 27, 1997

[51] Int. Cl.[6] ........................................................ H05K 3/32
[52] U.S. Cl. ........................ 174/260; 174/254; 361/761; 361/773
[58] Field of Search ..................................... 174/254, 260, 174/261; 361/749, 761, 763, 764, 773, 774, 803; 439/67, 68, 74, 77

[56] References Cited

U.S. PATENT DOCUMENTS

| | | | |
|---|---|---|---|
| 4,542,439 | 9/1985 | Dick | 361/773 |
| 4,631,820 | 12/1986 | Harada et al. | 29/840 |
| 4,985,600 | 1/1991 | Heerman | 174/255 |
| 5,200,884 | 4/1993 | Ohashi | 361/761 |
| 5,384,691 | 1/1995 | Neugebauer et al. | 361/794 |
| 5,430,614 | 7/1995 | Difrancesco | 361/785 |
| 5,506,514 | 4/1996 | Difrancesco | 324/757 |
| 5,579,206 | 11/1996 | McLellan et al. | 174/260 X |
| 5,606,198 | 2/1997 | Ono et al. | 257/666 |
| 5,745,984 | 5/1998 | Cole, Jr. et al. | 174/260 X |

FOREIGN PATENT DOCUMENTS

| | | |
|---|---|---|
| 3326968 | 2/1985 | Germany . |
| 9012638 | 11/1990 | Germany . |
| 62-262447 | 5/1988 | Japan . |
| 01074794 | 7/1989 | Japan . |
| 02073687 | 5/1990 | Japan . |
| 03049178 | 5/1991 | Japan . |
| 04354174 | 4/1993 | Japan . |
| 08255815 | 2/1997 | Japan . |
| 1 240 789 | 12/1969 | United Kingdom . |
| WO9013990 | 11/1990 | WIPO . |

Primary Examiner—Hyung-Sub Sough
Attorney, Agent, or Firm—Leslie C. Hodges

[57] ABSTRACT

An electrical circuit assembly which requires no solder processing, including an electronic component having terminations arranged on at least one of its surfaces, and a molded curviplanar substrate having circuit traces thereon and a cavity formed therein, wherein the cavity substantially conforms in shape with the electronic component. Proximate the cavity is a plurality of electrical contacts, arranged in matched relation with the respective terminations of the electronic component, with at least one of the electrical contacts being connected to at least one of the circuit traces on the substrate. The cavity and electrical contacts are dimensioned such that an interference fit is provided between the component's terminations and the electrical contacts, such that the component is held within the cavity when the component is placed therein. The component is disposed in the cavity such that its terminations are in physical and electrical connection with their respective electrical contacts.

14 Claims, 5 Drawing Sheets

THREE-DIMENSIONAL MOLDED SOCKETS FOR MECHANICAL AND ELECTRICAL COMPONENT ATTACHMENT

BACKGROUND OF THE INVENTION

1. Field of the Invention

The present invention relates generally to the mounting of electronic components. More particularly, the present invention relates to mounting electronic components to three-dimensional-surface substrates using molded sockets.

2. Disclosure Information

The attachment of electronic components to circuit board substrates is typically achieved by soldering. Various soldering techniques are used in the electronics industry, including the conventional practices of reflow soldering, wave soldering, and vapor-phase soldering. Each of these processes requires the use of metal alloy solders that process at relatively high temperatures. Furthermore, each of these processes ha, been developed for use with planar circuit boards.

Figures 1A, 1B:
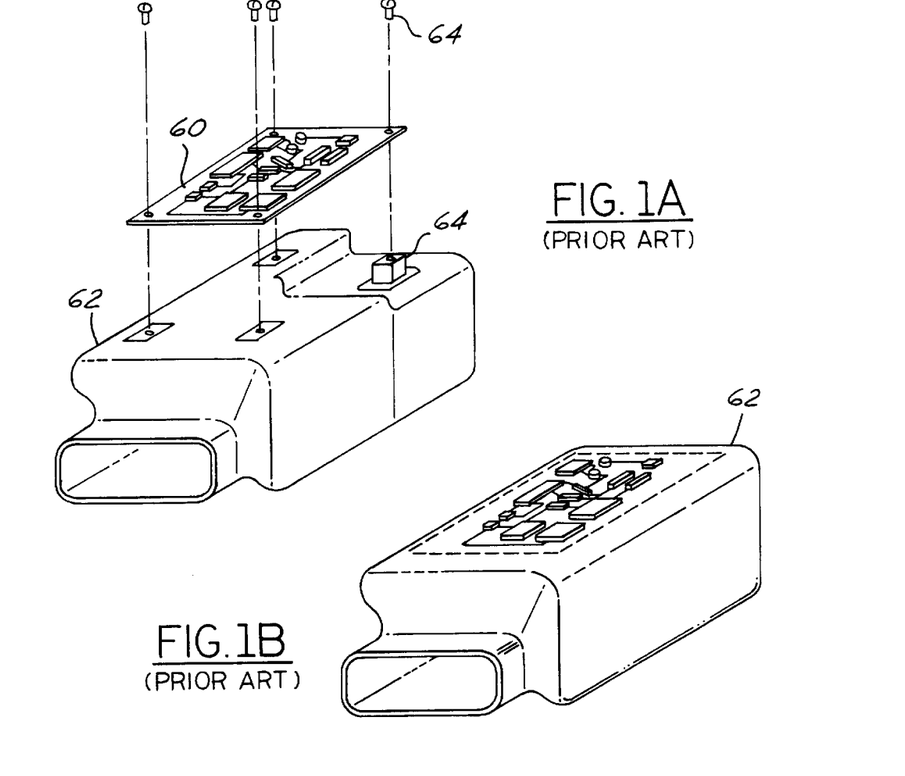
FIGS. 1A and 1B are perspective views of molded structures coupled with electronic components and circuitry according to the prior art.

Recently, interest has grown in the use of non-planar (i.e., "three-dimensional" or "curviplanar") circuit substrates as a more flexible design alternative to conventional planar circuit boards. For example, as illustrated in FIG. 1A, circuits and components which in the past were placed on rigid, planar circuit boards 60 with the boards then being attached by fasteners 64 to a molded plastic housing 62, are now being placed directly on an interior or exterior surface of the housing itself, as shown in FIG. 1B. In this type of arrangement, the surface of the molded housing 62 is typically metallized and the electronic components and circuitry are soldered thereto, the housing thus replacing the planar circuit board and serving as the substrate for the components and circuitry. This arrangement offers the advantage of integrating the electronics together with the structural housings or other adjacent molded structures, thus reducing the number of processing steps, eliminating unnecessary fasteners and other hardware 64, and reducing to overall product costs.

However, this type of integrated structure suffers from its inability to be processed using conventional soldering techniques, for at least two reasons. First, the non-planar surfaces of such integrated structures cause the structures to be incompatible with conventional soldering equipment, such as reflow ovens and the like, which can only process planar substrates. Second, the plastic resins used to make such integrated structures often cannot withstand the thermal excursions and/or chemical attack of conventional solder processing.

It would be desirable, therefore, to provide a way of integrating electronic circuitry with three-dimensional molded substrates in such a way that would eliminate the need for soldering altogether.

SUMMARY OF THE INVENTION

The present invention overcomes the shortcomings mentioned above by providing an electrical circuit assembly which requires no solder processing, comprising an electronic component having terminations arranged on at least one of its surfaces, and a molded curviplanar substrate having circuit traces thereon and a cavity formed therein, wherein the cavity substantially conforms in shape with the electronic component. Proximate the cavity is a plurality of electrical contacts, arranged in matched relation with the respective terminations of the electronic component, with at least one of the electrical contacts being connected to at least one of the circuit traces on the substrate. The cavity and electrical contacts are dimensioned such that an interference fit is provided between the component's terminations and the electrical contacts, such that the component is held within the cavity when the component is placed therein. The component is disposed in the cavity such that its terminations are in physical and electrical connection with their respective electrical contacts. The invention may also include such additional features as an adhesive placed between a bottom surface of the electronic component and a respective surface of the cavity, and an overmolding of electrically insulative material sealably covering each electronic component and a portion of the substrate peripherally adjacent each electronic component.

It is an advantage of the present invention that electronic circuits and components may be directly integrated with structural housings or other curviplanar molded substrates, thus reducing processing steps, the number of parts required, and overall product costs.

Another advantage of the present invention is that such integration of electronic circuits and components with curviplanar molded substrates may be accomplished without the use of solder processing.

Yet another advantage of the present invention is the ability to use low-temperature-melting plastic as a substrate material for such electronic circuits and components.

These and other advantages, features and objects of the invention will become apparent from the drawings, detailed description and claims which follow.

DETAILED DESCRIPTION OF THE PREFERRED EMBODIMENTS

Figure 2A:
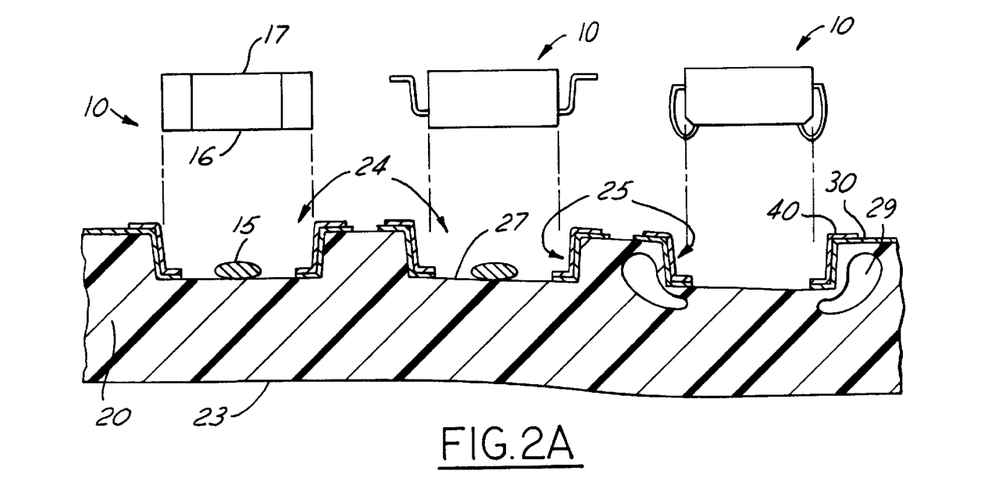
FIGS. 2A–2C are elevational cross-section views of a first embodiment of the present invention, showing, respectively, electronic components before, during, and after insertion into their respective cavities.
Figure 2B:
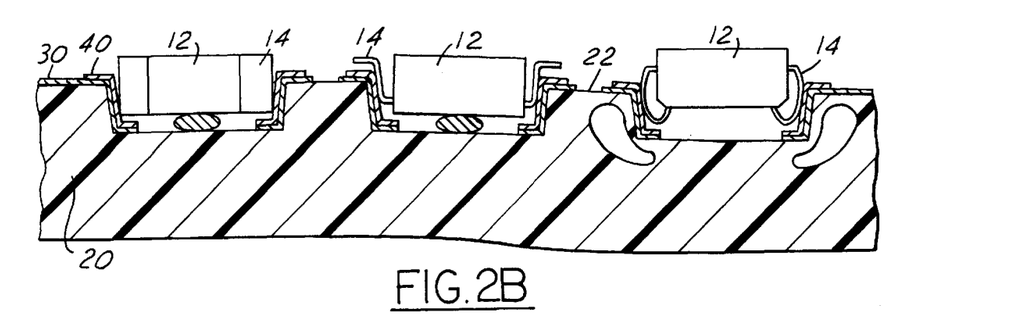
Figure 2C:
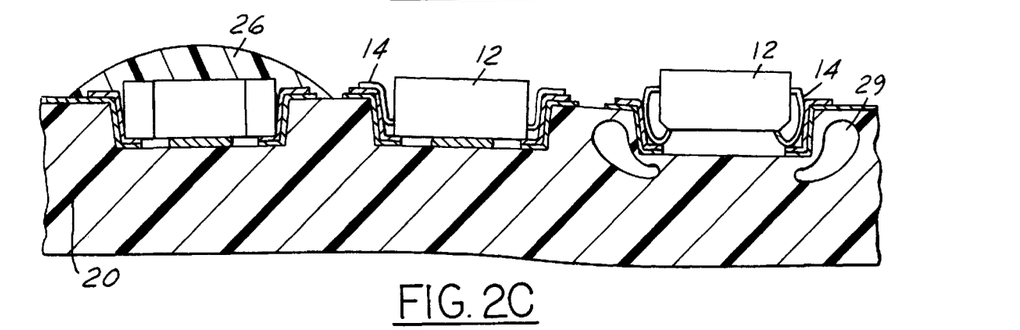

Referring now to the drawings, FIGS. 2A–2C show a first embodiment of the present invention wherein an electronic component 10 is electrically connected to circuit traces 30 arranged on a first surface 22 of a generally curviplanar molded plastic substrate 20, without the use of solder. The substrate 20 may also have a second surface 23 generally conforming in shape with that of the first surface 22. The first surface 22 and second surface 23 may be exterior and interior surfaces of the substrate 20, respectively, or vice versa. In this embodiment, the electronic component 10 has a body 12 with terminations 14 arranged on at least one surface thereof. A cavity 24 is formed on the first surface 22 of substrate 20, but does not extend through to the substrate's second surface 23 (i.e., the cavity 24 is not a through-hole). The shape of the cavity 24 substantially conforms with that of the component 10 to be placed therein. Examples of such components 10 and their respective cavities 24 are shown in FIGS. 3A–3H.

Proximate the cavity 24 a plurality of electrical contacts 40 are arranged in matched relation with the terminations 14 of the component 10. At least one of these contacts 40 is connected to at least one circuit trace 30 on the substrate 20. These contacts 40 may consist of metallizations, foils, thin conductive films, pins, plates, etc. and may be formed by such processes as chemical plating, vacuum metal vapor deposition, flex circuit in-molding, insert molding, lamination, embossing, adhesion, and the like. For example, the electrical contacts 40 may be tin metallizations deposited directly onto the substrate 20 (and in contact with the appropriate copper circuit traces 30) by electrodeposition. The contacts 40 may also be constructed using multiple layers of metallizations. For example, a base metallization of copper may be deposited onto the substrate 20 when the circuit traces 30 (also typically copper) are placed thereon. On top of this base metallization a second layer consisting of tin may then be deposited. Additionally, intermediate layers of metal—such as palladium, gold, and the like—may be sandwiched between the base metallization and the outer metallization, to prevent the formation of undesirable intermetallic compounds therebetween. The contacts 40 are arranged on at least the inner cavity walls 25, but may also extend onto some portion of the substrate surface 22 peripheral to the cavity 24 and/or onto some portion of the cavity floor 27.

The component 10 is placed into the cavity 24 such that its terminations 14 are brought into physical and electrical connection with their respective contacts 40. This is facilitated by dimensioning the respective cavity 24 and contacts 40 for a given component 10 such that an interference fit is provided between the contacts 40 and the terminations 14 of the component 10, so as to hold the component 10 within the cavity 24 after insertion is completed. This is illustrated in FIG. 2B, wherein the component terminations 14 are shown to encounter an interference fit with their respective contacts 40 at some point during insertion of the component 10 into the cavity 24. The inner cavity walls 25 may also be formed with a draft to further facilitate both insertion and interference. The tolerance on such dimensions as cavity width, cavity depth, cavity wall draft angle, contact thickness, and contact draft angle should be controlled such that the interference fit will allow the component 10 to be pressed into the cavity 24 to the desired depth while also holding the component 10 therein, as illustrated in FIG. 2C. This may be further facilitated by forming the contacts 40 from a substantially malleable metal alloy, and/or by placing an adhesive 15 between a bottom surface 16 of the component 10 and a surface of the cavity 24 proximate the component's bottom surface 16.

The cavity 24 and contacts 40 may be dimensioned such that the component 10 is positioned so that the component top surface 17 is substantially flush with the adjacently surrounding substrate surface 22. Additionally, either with or without the component top surface 17 being flush with the substrate surface 22, an overmolding or potting 26 may be placed over a component 10 and a portion of the substrate surface 22 peripherally adjacent the component 10, thereby sealing the component 10 from any harsh environmental factors which may exist, as well as providing additional means for holding the component 10 within the cavity 24. Such an overmolding 26 may be composed of a material which has a coefficient of thermal expansion substantially equivalent to that of the substrate material, so that thermal strain therebetween may be minimized. The overmolding 26 may also cover more than one component 10.

The substrate 20 may also include internal voids 29 formed therein proximate the inner cavity walls 25, as illustrated in FIGS. 2A–2C. These voids 29 provide additional resilience to the cavity walls 25, thereby aiding in insertion and retention of the component 10 within the cavity 24. These voids 29 may be formed by gas injection or other means during the substrate molding process.

Preferably both the terminations 14 and the contacts 40 are composed of a metal or metal alloy which is substantially inert to oxidation, such as gold, palladium, or alloys of tin, lead, and/or bismuth. Alternatively, the terminations 14 and/or contacts 40 may have a multilayer construction wherein at least the outermost layer is composed of a metal substantially inert to oxidation, or an inorganic antioxidant coating. However, even if the outer surfaces of the terminations 14 and/or contacts 40 are not substantially inert, further urging of the component 10 into the cavity 24 after interference is encountered will cause a wiping of the terminations 14 against the contacts 40 to occur, thereby removing at least some of any oxide layer that may have formed on the terminations 14 and/or contacts 40.

Figures 3A, 3B:
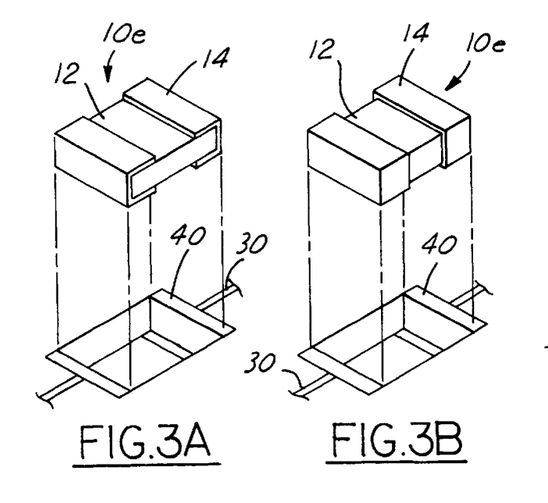
FIGS. 3A–3H are perspective views of various electronic components which may be used in a first embodiment of the present invention, along with their respective cavities.
Figure 3C:
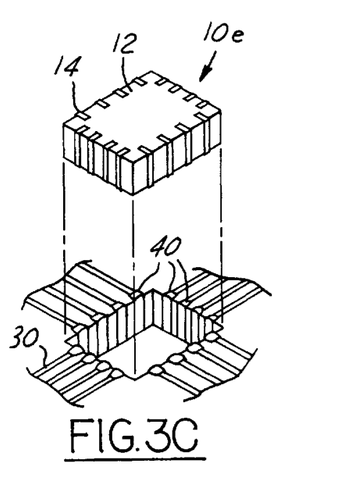
Figure 3D:
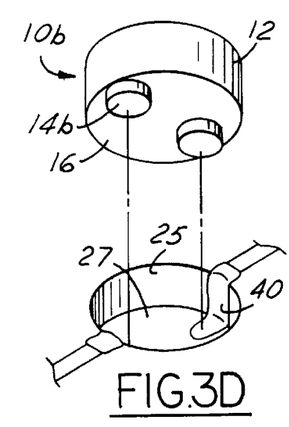
Figure 3E:
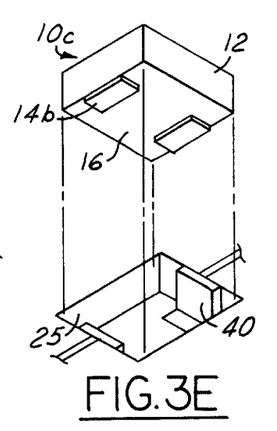
Figure 4A:
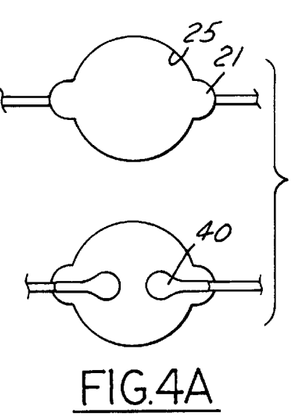
FIGS. 4A and 4B are top plan views of cavities for bottom-terminated electronic components, shown before and after electrical contact deposition, as viewed along section lines 1—1 and 2—2 of FIGS. 3D and 3E, respectively.
Figure 4B:
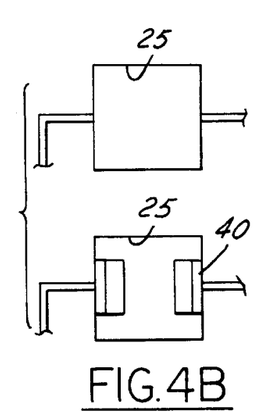

It should be noted that the component 10 may have its terminations 14b arranged on its bottom surface 16, as illustrated by components 10b and 10c in FIGS. 3D and 3E. For such a device, the contacts 40 are disposed on the inner cavity walls 25 and extend onto the cavity floor 27 underneath and in matched relation to the bottom terminations 14b. The cavity 24 is dimensioned and the contacts 40 arranged such that an interference fit is provided between the component body 12 and the cavity inner walls 25, so that the component 10 is held within the cavity 24 when the component 10 is positioned therein. FIG. 4A shows that notches 21 may be formed in the inner cavity walls 25 in order to recess the contacts 40 away from the component body 12, so that the contacts 40 do not interfere therewith. As an alternative to the notches 21, the cavity can be dimensioned so that two opposing inner cavity walls 25 or wall portions provide an interference fit with the body 12 of the component while two other opposing inner cavity walls 25 or wall portions are spaced apart from the component body 12. In this arrangement the contacts 40 are disposed on the spaced-apart walls 25 or wall portions and the cavity floor 27. As a further alternative, instead of an interference fit being provided between the component body 12 and the cavity inner walls 25, it is possible to dimension the cavity walls 25 and contacts 40 such that an interference fit is provided between the component body 12 and the contacts 40 themselves, as illustrated by component 10c and contacts 40 in FIGS. 3E and 4B.

A wide variety of components can be utilized with this first embodiment. For example, FIGS. 3A–3H show various terminated components 10e (such as a leadless ceramic chip carrier, or LCCC), various bottom-terminated devices 10b/10c, a plastic leaded chip carrier (PLCC) 10p, an inverted quad-flat-pack (QFP) device 10q, and an inverted dual in-line package (DIP) device 10d, along with their respective cavity and contact configurations.

Figure 5A:
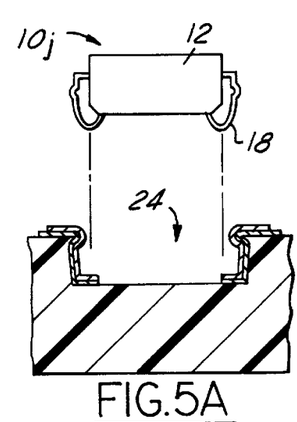
FIGS. 5A–5D are elevational cross-section views of additional configurations according to a first embodiment of the present invention showing nib-leaded electronic components before insertion into their respective cavities.
Figure 5B:
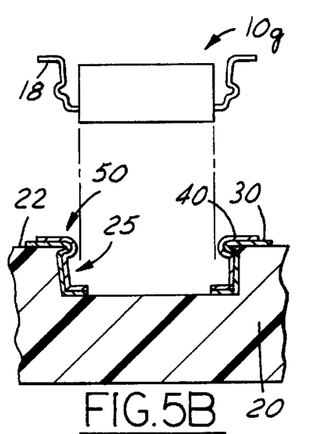
Figure 5C:
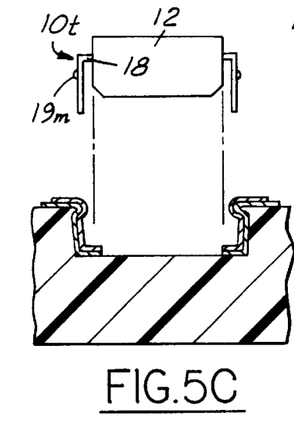
Figure 5D:
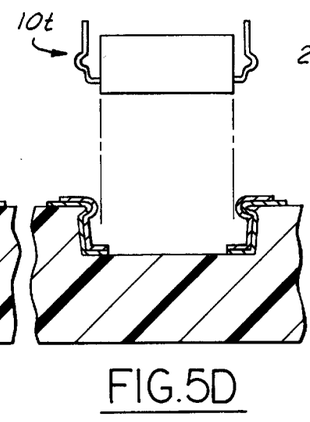
Figure 5E:
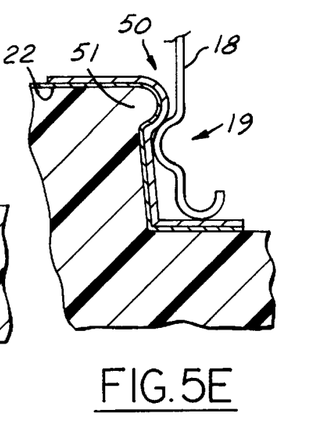
FIG. 5E is an enlarged, partial view of FIG. 5A, showing a lip and nibbed lead after insertion of the component into its respective cavity.
Figure 6A:
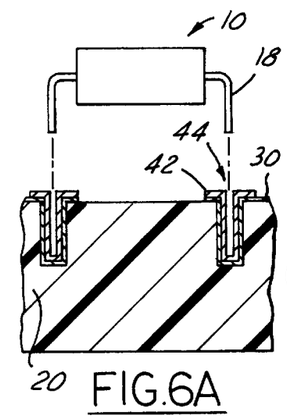
FIGS. 6A–6D are elevational cross-section views of a second embodiment of the present invention, showing, leaded electronic components before insertion of their leads into their respective receptacles.
Figure 6B:
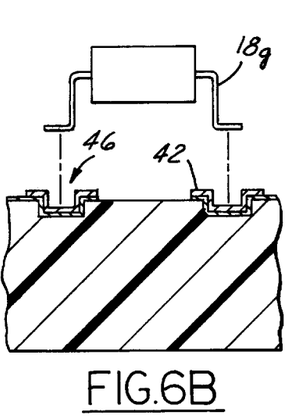
Figure 6C:
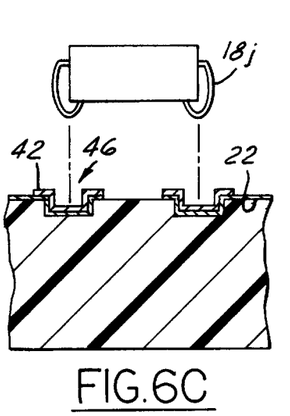
Figure 6D:
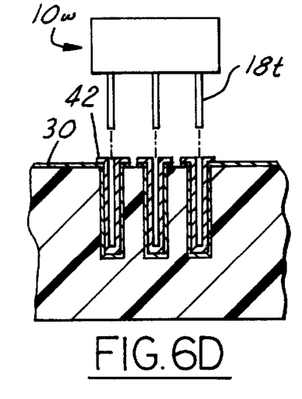

When using J-leaded, gull-winged, or other components 10 having springlike leads 18 projecting from at least one edge of the component body 12, wherein the leads 18 are inwardly and resiliently deflectable toward the body 12, the cavities 24 for such devices may incorporate an additional feature to aid in holding the component 10 within the cavity 24 after insertion therein. This feature comprises a lip 50 located at an intersection between the inner cavity walls 25 and the substrate surface 22, as shown in FIGS. 5A–5E. The lip 50 extends a predetermined distance into the cavity 24, and may be formed, for example, by forcing a ridge 51 on the substrate 20 at this location which projects toward the interior of the cavity 24 (e.g., using cam-actions during the molding of the substrate 20), followed by deposition of the contacts 40 over this ridge 51. Alternatively, the substrate 20 may be formed without such a ridge 51, and the contacts 40 may consist of metal inserts which have the lip 50 formed thereon, the inserts then being affixed to the substrate 20 proximate the cavity so as to properly position the lip 50. In complement to this lip 50, each of the leads 18 is bent so as to provide an outwardly extending nib 19 thereon, each nib 19 being positioned along each lead 18 such that each nib 19 is seated underneath and in contact with the lip 50 when the component 10 is positioned in the cavity 24, as shown in FIG. 5E. Alternatively, instead of the nibs 19 being formed by bends in the leads 18, nibs 19 may be formed by welding or otherwise attaching a small tab of material 19m to each lead 18 at the appropriate place. The extent to which the lip 50 extends inward into the cavity 24 is determined so as to allow the leads 18 to be easily deflected inwardly and the component 10 to be easily inserted into the cavity 24, while providing a sufficient underside lip area so that the nibs 19 may be seated thereagainst after insertion, as illustrated in FIG. 5E. Components 10 suitable for use of this nib-and-lip feature include, but are not limited to, J-leaded devices 10j (e.g., PLCCs), inverted gull-winged devices 10g (e.g., QFPs and small outline integrated circuits, or SOICs), and inverted or right-side-up through-hole-leaded devices 10t (e.g., through-hole DIPs).

Figure 3F:
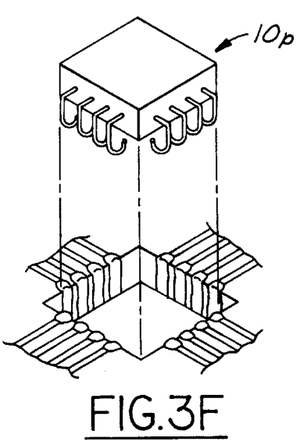
Figure 3G:
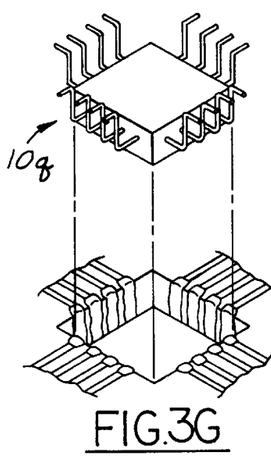
Figure 3H:
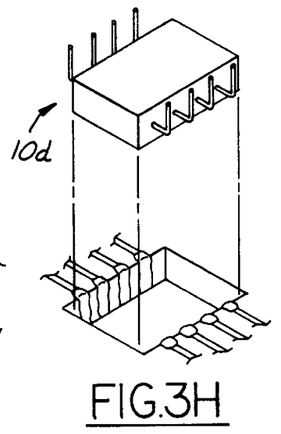

(It should be noted that "leads", as used herein, denotes the type of electrical conductors which project outward from the body of the component and which generally have a length greater than their thickness, such as those found on DIPs, PLCCs, QFPs, SOICs, and conventional plated-through-hole (PTH) components, as variously shown in FIGS. 3F–3H. Likewise, "leads" may also refer to the pin-type connectors found on pin grid array (PGA) devices and some daughter boards. On the other hand, "terminations", as used herein, denotes both (1) "leads", as just described, and (2) the type of electrical conductor which does not project significantly from the body of the component (i.e., conductors whose length of projection out from the component body is generally less than the conductor's thickness), such as those found on end-terminated devices 10e and bottom-terminated devices 10b/10c, as shown in FIGS. 3A–3E. "Terminations" may also refer to the bump-like connectors found on such components as ball grid array (BGA) devices and the like.)

A second embodiment of the present invention is illustrated in FIGS. 6A–6D. This embodiment comprises a component 10 having leads 18 arranged on at least one edge thereof, a curviplanar molded substrate 20 having circuit traces 30 thereon, and a plurality of electrical receptacles 42 disposed and arranged in the substrate 20 in matched relation with the component leads 18. Each of these receptacles 42 has an opening 44/46 therein, into which a component lead 18 may be fastenably inserted, the opening 44/46 being dimensioned such that an interference fit is provided between each individual receptacle 42 and its respective lead 18. At least one of the receptacles 42 is connected to at least one circuit trace on the substrate 20. The component 10 is disposed such that each lead 18 is inserted into its respective receptacle 42.

Figure 7A:
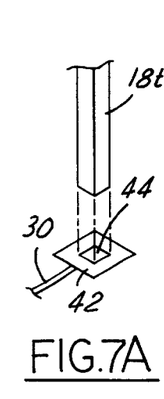
FIGS. 7A–7D are perspective views of receptacle openings according to a second embodiment of the present invention.
Figure 7B:
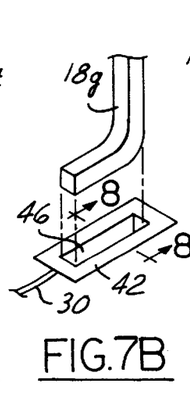
Figure 7C:
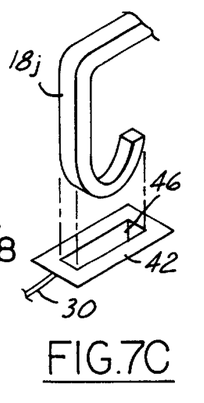
Figures 7D, 8:
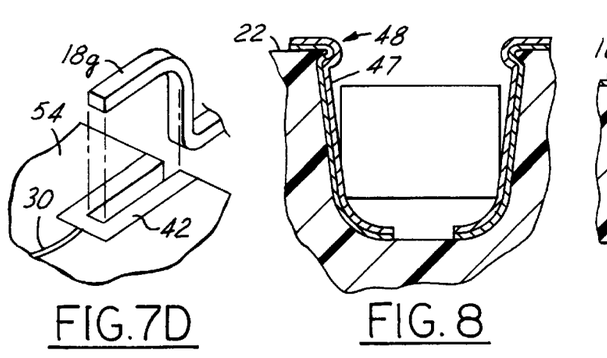
FIG. 8 is an elevational, cross-sectional end view of a trough-like receptacle opening, as viewed along section line 8—8 of FIG. 7B.

Each receptacle 42 has an opening 44/46 into which its respective lead 18 is to be inserted. The opening 44/46 may assume one of two different configurations, depending upon the type of leads 18 projecting from the component 10 to be inserted therein. First, for components 10j/10g having J-leads 18j or gull-wing leads 18g, the corresponding receptacles 42 have a generally trough-like opening 46 oriented such that the opening's longitudinal axis is generally tangent to the immediately adjacent substrate surface 22, as depicted in FIGS. 7B and 7C. This type of opening 46 may also incorporate an overhang 48 formed therein, located at an intersection between the opening inner walls 47 and the substrate surface 22, as shown in FIG. 8. Second, for components 10t having through-hole-type leads 18t (e.g., pin grid arrays (PGAs) 10w and DIPs 10d), the corresponding receptacles 42 have a generally bore-like opening 44 oriented such that the opening's longitudinal axis is generally orthogonal to the immediately adjacent substrate surface 22, as depicted in FIG. 7A. This opening 44 may be a through-hole going completely through to the substrate second surface 23, or may be a blind hole.

The receptacles 42 may consist of metallizations, platings, foils, thin conductive films, and the like, which are deposited or molded into generally trough-shaped or bore-shaped reliefs formed on the substrate surface 22, there being one relief for each receptacle 42. For example, in the case of components 10t having through-hole-type leads, the receptacles 42 may be formed by metallized or plated through-holes (or blind-holes) formed in the substrate 20. Alternatively, the receptacles 42 may consist of individual metal inserts or sleeves which are inserted or molded into the substrate 20.

Whereas in the first embodiment all of a component's respective contacts 40 are arranged proximate a single, component-shaped cavity 24, no such single cavity is needed in the present embodiment. In the first embodiment, the contacts 40 act collectively to restrain the entire component 10; i.e., an interference fit is provided between (1) the contacts 40 as a whole and (2) the component 10 as a whole. However, in the present embodiment the receptacles 42 act independently rather than collectively, such that multiple interference fits are provided per component; i.e., one interference fit for each individual receptacle/lead insertion is provided.

Although no singular, component-shaped cavity 24 is necessary in the present embodiment, such a cavity 24 may be provided on the substrate surface 22 such that the component 10 is received therein when the leads 18 are inserted into their respective receptacles 42. This arrangement is illustrated by component 10x in FIG. 9A. Alternatively, both the component 10y and its plurality of receptacles 42 may be placed within a cavity 24, as shown in FIGS. 9B and 9D, thereby facilitating an overmolding 26 whose top surface may be generally flush with the surrounding substrate surface 22. When utilizing such a recess 28 with gull-winged components 10g, a shoulder 52 may be formed within the recess 28 with the receptacles 42 disposed and arranged on a top surface 54 of the shoulder 52, as shown in FIG. 9C. This arrangement, like the previous alternative, also facilitates flush overmolding. A typical receptacle 42 for such an arrangement, wherein inverted gull-winged components 10g are situated within a recess 28, is shown in FIG. 7D.

Figure 9A:
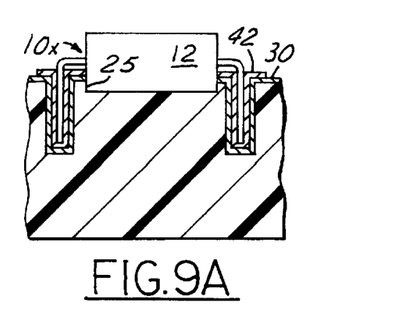
FIGS. 9A–9D are elevational cross-section views of additional configurations according to a second embodiment of the present invention.
Figure 9B:
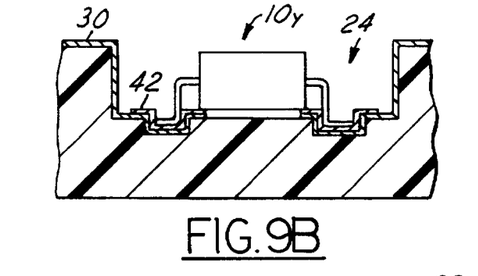
Figure 9C:
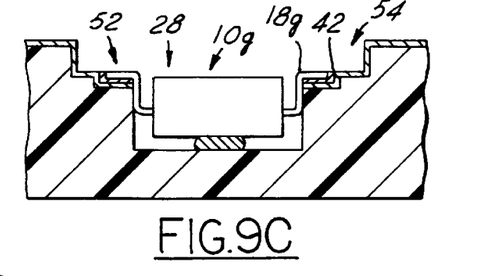
Figure 9D:
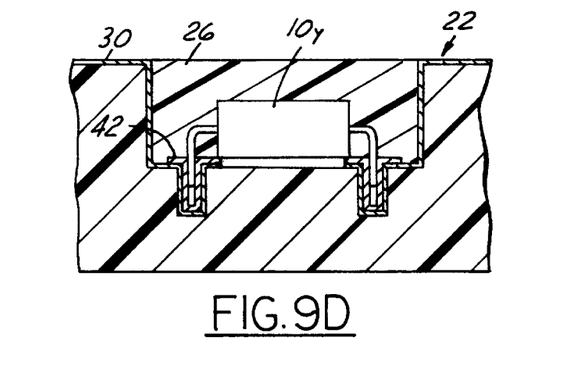

When cavities 24 are utilized with components 10x according to the present embodiment, as; shown in FIG. 9A, the inner cavity walls 25 may be dimensioned so as to provide an interference fit between the walls 25 and the body 12 of the component 10. Likewise, for inverted gull-wing components 10g as shown in FIG. 9C, the inner cavity walls 25 may be dimensioned so as to provide an interference fit between the walls 25 and the leads 18.

Figure 10:
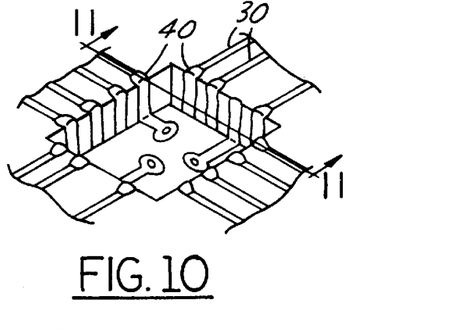
FIG. 10 is a perspective view of an additional configuration according to a first embodiment of the present invention, showing a cavity and contacts incorporating a through-hole conductive path between the first and second substrate surfaces.
Figure 11:
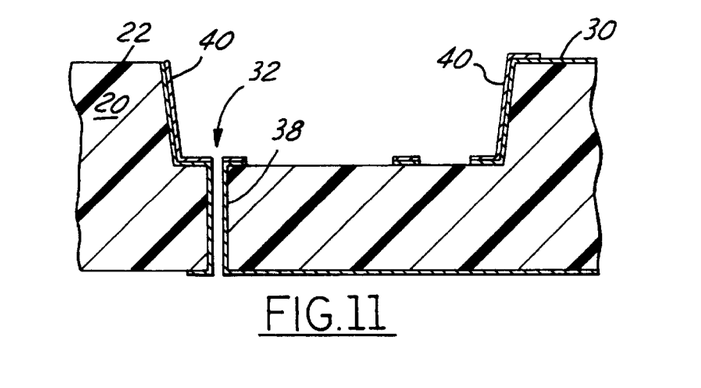
FIG. 11 is an elevational cross-section view taken along section line 3—3 of FIG. 10.

In both the first and second embodiments of the present invention, there may also be circuit traces 30 arranged on the second surface 23 of the substrate 20, in addition to having circuit traces 30 arranged on the first surface 22, as illustrated in FIGS. 10 and 11. Conductive paths 38 may be formed between the first and second surfaces 22/23 so as to connect one or more terminations 14 with their respective circuit traces 30 on the second surface 23. The conductive paths 38 may consist of through-holes 32 formed in the substrate 20 and plated or otherwise coated with electrically conductive material, or may consist of a plug or pin of conductive material inserted or otherwise disposed within the through-hole 32. The conductive material may consist of the same material used to form the circuit traces 30 (usually copper), or the same material used to form the contacts 40, or some different material.

Various other modifications to the present invention will, no doubt, occur to those skilled in the art to which the present invention pertains. For example, in the case of an inverted gull-wing component 10g used in the above first embodiment, the contacts 40 may be arranged on the substrate first surface 22 immediately adjacent the cavity 24, rather than on the inner cavity walls 25. In such an arrangement, the cavity depth is dimensioned such that the component leads 18 come into physical and electrical contact with their respective electrical contacts 40 when the component 10g is positioned within the cavity 24. Also in such an arrangement, no interference fit would be provided between the contacts 40 and leads 18; rather, an interference fit is provided between the inner cavity walls 25 and the leads 18, by proper dimensioning of the cavity 24. As an additional modification, a component's leads 18 and their respective electrical contacts 40 or receptacles 42 may be arranged in a staggered fashion on one or more sides of the component 10, rather than all being arranged in-line on each side. This arrangement may help avoid adjacent contacts 40 or receptacles 42 from shorting out against each other, particularly in use with finer-pitched components 10. It is the following claims, including all equivalents, which define the scope of the invention.

We claim:

1. An electrical circuit assembly, comprising:

an electronic component having a body with springlike leads projecting from at least one edge of said body, said leads being inwardly and resiliently deflectable toward said body;

a molded substrate having a generally curviplanar first surface with circuit traces thereon and a cavity formed therein, said cavity substantially conforming in shape with said electronic component; and a plurality of electrical contacts arranged proximate said cavity, said contacts being arranged in matched relation with said springlike leads of said electronic component, at least one of said electrical contacts being connected to at least one circuit trace on said substrate;

wherein said cavity and said electrical contacts are dimensioned such that an interference fit is provided between said electrical contacts and said springlike leads of said electronic component, such that said electronic component is held within said cavity when said component is positioned therein;

said electronic component being disposed in said cavity such that said springlike leads are in physical and electrical connection with their respective electrical contacts;

wherein said substrate includes a lip located at an intersection between inner walls of said cavity and said first surface of said substrate, said lip extending a predetermined distance into said cavity, wherein each of said springlike leads is bent so as to provide an outwardly extending nib thereon, each nib being positioned along each of said springlike leads such that each nib is seated underneath and in contact with said lip when said component is positioned in said cavity.

2. An electrical circuit assembly according to claim 1, further comprising an adhesive placed between a bottom surface of said electronic component and a surface of said cavity.

3. An electrical circuit assembly according to claim 1, further comprising an overmolding of electrically-insulative material sealably covering said electronic component and a portion of said substrate peripherally adjacent said electronic component.

4. An electrical circuit assembly according to claim 3, wherein said overmolding has a coefficient of thermal-expansion substantially equivalent to a coefficient of thermal expansion of said substrate.

5. An electrical circuit assembly according to claim 1, further including:

circuit traces arranged on a second surface of said substrate; and conductive paths disposed between said first and second surfaces of said substrate, so as to electrically connect at least one of said electrical contacts with a respective circuit trace on said second surface of said substrate.

6. An electrical circuit assembly according to claim 1, wherein said cavity and said electrical contacts are dimensioned such that when said electronic component is positioned within said cavity, a top surface of said electronic component is substantially flush with said first surface of said substrate.

7. An electrical circuit assembly according to claim 1, wherein said electrical contacts are composed of a metal substantially inert to oxidation.

8. An electrical circuit assembly according to claim 7, wherein said metal includes at least one metal selected from the group consisting of gold, palladium, tin, lead, and bismuth.

9. An electrical circuit assembly according to claim 1, wherein said electrical contacts are composed of a substantially malleable alloy.

10. An electrical circuit assembly according to claim 1, wherein said substrate includes internal voids formed therein proximate internal walls of said cavity.

11. An electrical circuit assembly, comprising:

an electronic component having terminations arranged on at least one surface thereof;

a molded substrate having a generally curviplanar first surface with circuit traces thereon and a cavity formed therein, said cavity substantially conforming in shape with said electronic component, wherein said molded substrate further includes internal voids formed therein proximate internal walls of said cavity; and a plurality of electrical contacts arranged proximate said cavity, said contacts being arranged in matched relation with said terminations of said electronic component, at least one of said electrical contacts being connected to at least one circuit trace on said substrate;

wherein said cavity and said electrical contacts are dimensioned such that an interference fit is provided between said electrical contacts and said terminations of said electronic component, such that said electronic component is held within said cavity when said component is positioned therein;

said electronic component being disposed in said cavity such that said terminations are in physical and electrical connection with their respective electrical contacts.

12. An electrical circuit assembly for use with an electronic component, comprising:

a molded substrate having a first surface;

a plurality of circuit traces disposed on said first surface;

a cavity defined in said first surface;

a plurality of electrical contacts arranged proximate said cavity, at least one of said electrical contacts being connected to at least one of said circuit traces; and at least one internal void formed in said molded substrate proximate internal walls of said cavity.

13. An electrical circuit assembly for use with an electronic component according to claim 12, wherein said cavity substantially conforms in shape with the electronic component.

14. An electrical circuit assembly for use with an electronic component according to claim 12, wherein said contacts are arranged in matched relation with terminations of the electronic component.

* * * * *